(12) United States Patent
Boulanger et al.

(10) Patent No.: US 9,377,363 B2
(45) Date of Patent: *Jun. 28, 2016

(54) INFRARED CAMERA ARCHITECTURE SYSTEMS AND METHODS

(71) Applicant: FLIR Systems, Inc., Wilsonville, OR (US)

(72) Inventors: Pierre Boulanger, Goleta, CA (US); Marcel Tremblay, Goleta, CA (US); Jim Goodland, Santa Barbara, CA (US); Barbara Sharp, Santa Barbara, CA (US); Farhad Mirbod, Santa Barbara, CA (US); Theodore R. Hoelter, Goleta, CA (US)

(73) Assignee: FLIR Systems, Inc., Wilsonville, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/294,090

(22) Filed: Jun. 2, 2014

(65) Prior Publication Data

US 2014/0267766 A1    Sep. 18, 2014

Related U.S. Application Data

(63) Continuation of application No. 12/844,124, filed on Jul. 27, 2010, now Pat. No. 8,743,207.

(51) Int. Cl.
*G01J 5/10* (2006.01)
*G01J 5/04* (2006.01)
*H04N 5/225* (2006.01)
(Continued)

(52) U.S. Cl.
CPC .................. *G01J 5/10* (2013.01); *G01J 1/0204* (2013.01); *G01J 1/44* (2013.01); *G01J 5/02* (2013.01); *G01J 5/023* (2013.01); *G01J 5/046* (2013.01); *G01J 5/20* (2013.01); *H01L 27/146* (2013.01); *H01L 27/14687* (2013.01);
(Continued)

(58) Field of Classification Search
CPC ............. G01J 5/02; G01J 5/023; G01J 5/046; G01J 5/20; H04N 5/2251; H04N 5/33; Y10T 29/49826
See application file for complete search history.

(56) References Cited

U.S. PATENT DOCUMENTS 5,352,926 A    10/1994  Andrews
5,420,419 A *  5/1995   Wood .......................... 250/338.4
(Continued)

FOREIGN PATENT DOCUMENTS

EP    1 816 454    8/2007

OTHER PUBLICATIONS

Mawer, Andrew, "Plastic Ball Grid Array (PBGA)", Motorola Semiconductor Technical Data, 1996, pp. 1-28, AN1231, Freescale Semiconductor, Inc.
(Continued)

*Primary Examiner* — Sath V Perungavoor
*Assistant Examiner* — Peter D Le
(74) *Attorney, Agent, or Firm* — Haynes and Boone, LLP (57) ABSTRACT

An infrared camera architecture includes, for an embodiment, an infrared detector, a substrate, a plurality of electrical components coupled to the substrate, and a pedestal made of a thermally conductive material and having a leg coupled to the substrate. The infrared detector is supported by and thermally coupled to the pedestal, with the pedestal thermally isolating the infrared detector from the plurality of electrical components.

20 Claims, 8 Drawing Sheets

(51) Int. Cl.
*H04N 5/33* (2006.01)
*G01J 5/02* (2006.01)
*G01J 5/20* (2006.01)
*G01J 1/02* (2006.01)
*G01J 1/44* (2006.01)
*H01L 27/146* (2006.01)
*G01J 5/00* (2006.01)

(52) U.S. Cl.
CPC ............ *H04N 5/2251* (2013.01); *H04N 5/33* (2013.01); *G01J 2005/0077* (2013.01); *Y10T 29/49826* (2015.01)

(56) References Cited

U.S. PATENT DOCUMENTS

| | | | |
|---|---|---|---|
| 5,534,697 | A | 7/1996 | Creekmore et al. |
| 5,640,045 | A | 6/1997 | Krausse, III |
| 6,028,309 | A | 2/2000 | Parrish et al. |
| 6,262,489 | B1 | 7/2001 | Koors et al. |
| 6,667,543 | B1 | 12/2003 | Chow et al. |
| 7,037,844 | B2 | 5/2006 | Däche et al. |
| 7,402,802 | B1 | 7/2008 | Terre et al. |
| 7,470,904 | B1 | 12/2008 | Schweikert et al. |
| 7,709,935 | B2 | 5/2010 | Islam et al. |
| 8,058,104 | B2 | 11/2011 | Islam et al. |
| 2004/0101020 | A1 | 5/2004 | Bhandarkar |
| 2004/0135912 | A1 | 7/2004 | Hofflinger et al. |
| 2007/0065984 | A1 | 3/2007 | Lau et al. |
| 2007/0138628 | A1 | 6/2007 | Lam |
| 2008/0048120 | A1 | 2/2008 | Gooch |
| 2009/0084958 | A1 | 4/2009 | Vogt |
| 2009/0140125 | A1 | 6/2009 | Takayama |
| 2009/0294957 | A1 | 12/2009 | Lam |
| 2011/0049703 | A1 | 3/2011 | Hsu et al. |
| 2011/0089462 | A1 | 4/2011 | Van Heerden et al. |
| 2011/0266445 | A1* | 11/2011 | Beratan .............. 250/338.4 |
| 2012/0026337 | A1 | 2/2012 | Boulanger et al. |

OTHER PUBLICATIONS

Lapisa et al., "Wafer-Level Heterogeneous Integration for MOEMS, MEMS, and NEMS", IEEE Journal of Selected Topics in Quantum Electronics, May/Jun. 2011, pp. 629-644, vol. 17, No. 3.

Zimmer et al., "One-Megapixel Monocrystalline-Silicon Micromirror Array on CMOS Driving Electronics Manufactured With Very Large-Scale Heterogeneous Integration", Journal of Microelectromechanical Systems, Jun. 2011, pp. 564-572, vol. 20, No. 3.

Niklaus et al., "Performance model for uncooled infrared bolometer arrays and performance predictions of bolometers operating at atmospheric pressure", ScienceDirect, 2008, pp. 168-177 Infrared Physics & Technology.

Lapadatu et al., "Cu—Sn wafer level bonding for vacuum encapsulation of microbolometer focal plane arrays", Sensonor Technologies AS, 2010, 1 page, Abstract #1693, 218th ECS Meeting, The Electrochemical Society.

Ericsson et al., "Towards 17 μm pitch heterogeneously integrated Si/SiGe quantum well bolometer focal plane arrays", SPIE, May 31, 2011, pp. 1-10, Proc. of SPIE vol. 8012, 801216-8.

* cited by examiner

INFRARED CAMERA ARCHITECTURE SYSTEMS AND METHODS

CROSS-REFERENCE TO RELATED APPLICATIONS

This application is a continuation of U.S. patent application Ser. No. 12/844,124 filed Jun. 27, 2010 and entitled "INFRARED CAMERA ARCHITECTURE SYSTEMS AND METHODS," which is hereby incorporated by reference in its entirety.

TECHNICAL FIELD

One or more embodiments of the invention relate generally to infrared cameras and, more particularly, to infrared camera architectures.

BACKGROUND

Thermal infrared cameras are well known and used in a wide variety of applications. A typical thermal infrared camera, often referred to simply as an infrared camera or IR camera, uses an infrared detector to detect infrared energy that is provided to the infrared detector through an infrared camera lens—a lens capable of transmitting infrared energy. The infrared camera may also include a display for a user to view images generated by the infrared camera based on the infrared energy, or the images may be stored by the infrared camera or transmitted (e.g., via a wireless or wired network) for remote viewing and/or storage.

A conventional infrared camera typically includes a large number of individual, non-integrated, electronic components that require various printed circuit boards and power supply voltages to support these electrical components. The conventional infrared camera may also require an external heat sink or other type of external, thermal management device to control temperature conditions associated with the infrared detector and other sensitive components of the infrared camera.

Furthermore, the conventional infrared camera may have cumbersome optical alignment procedures and/or complex calibration processes that may need to be performed by a user integrating the infrared camera into a desired system. Consequently, the conventional infrared camera may represent a device that is relatively expensive to manufacture and complex to integrate into a desired system. As a result, there is a need for an improved infrared camera architecture.

SUMMARY

Infrared camera architecture systems and methods are disclosed in accordance with one or more embodiments of the invention. For example, in accordance with one or more embodiments of the invention, an infrared camera architecture is disclosed that integrates various elements of an infrared camera, such as electronics, thermal management, and/or optical alignment, into a single package that may be manufactured using high volume manufacturing processes. This infrared camera architecture, for one or more embodiments of the invention, may offer an elegant solution (e.g., relative to conventional, complex infrared camera alternatives) that may be easily designed into various products by system engineers without the usual complexity and without the need for in-depth, infrared domain knowledge.

More specifically, in accordance with one embodiment of the invention, an infrared camera includes an infrared detector; a substrate; a plurality of electrical components coupled to the substrate; a pedestal made of a thermally conductive material and having a leg coupled to the substrate, wherein the infrared detector is supported by and thermally coupled to the pedestal, the pedestal thermally isolating the infrared detector from the plurality of electrical components; and a core housing coupled to the infrared detector, the substrate, the pedestal, and the plurality of electrical components to form an infrared camera core.

In accordance with another embodiment of the invention, an infrared camera includes an infrared detector adapted to capture infrared images; a pedestal coupled to the infrared detector and having an infrared detector alignment feature; a substrate coupled to the pedestal; a die stack coupled to the substrate, wherein the pedestal is configured to thermally protect the infrared detector from the die stack; an infrared camera core housing configured to at least partially house the infrared detector, the pedestal, the substrate, and the die stack to form an infrared camera core; a camera housing having an optical alignment feature within the camera housing and at least partially enclosing the infrared camera core; and a lens within the camera housing; wherein the optical alignment feature and the infrared detector alignment feature are coupled to provide optical alignment of the infrared detector with the lens.

In accordance with another embodiment of the invention, a method of assembling an infrared camera includes mounting a die stack to a substrate; securing a pedestal to the substrate and above the die stack, the pedestal made of a thermally conductive material; adhering an infrared detector to the pedestal, wherein the pedestal is configured to thermally isolate the infrared detector from the die stack; and encapsulating at least partially the substrate, the die stack, the pedestal, and the infrared detector in a core housing to form an infrared camera core.

The scope of the invention is defined by the claims, which are incorporated into this Summary by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figures 1A, 1B, 1C:
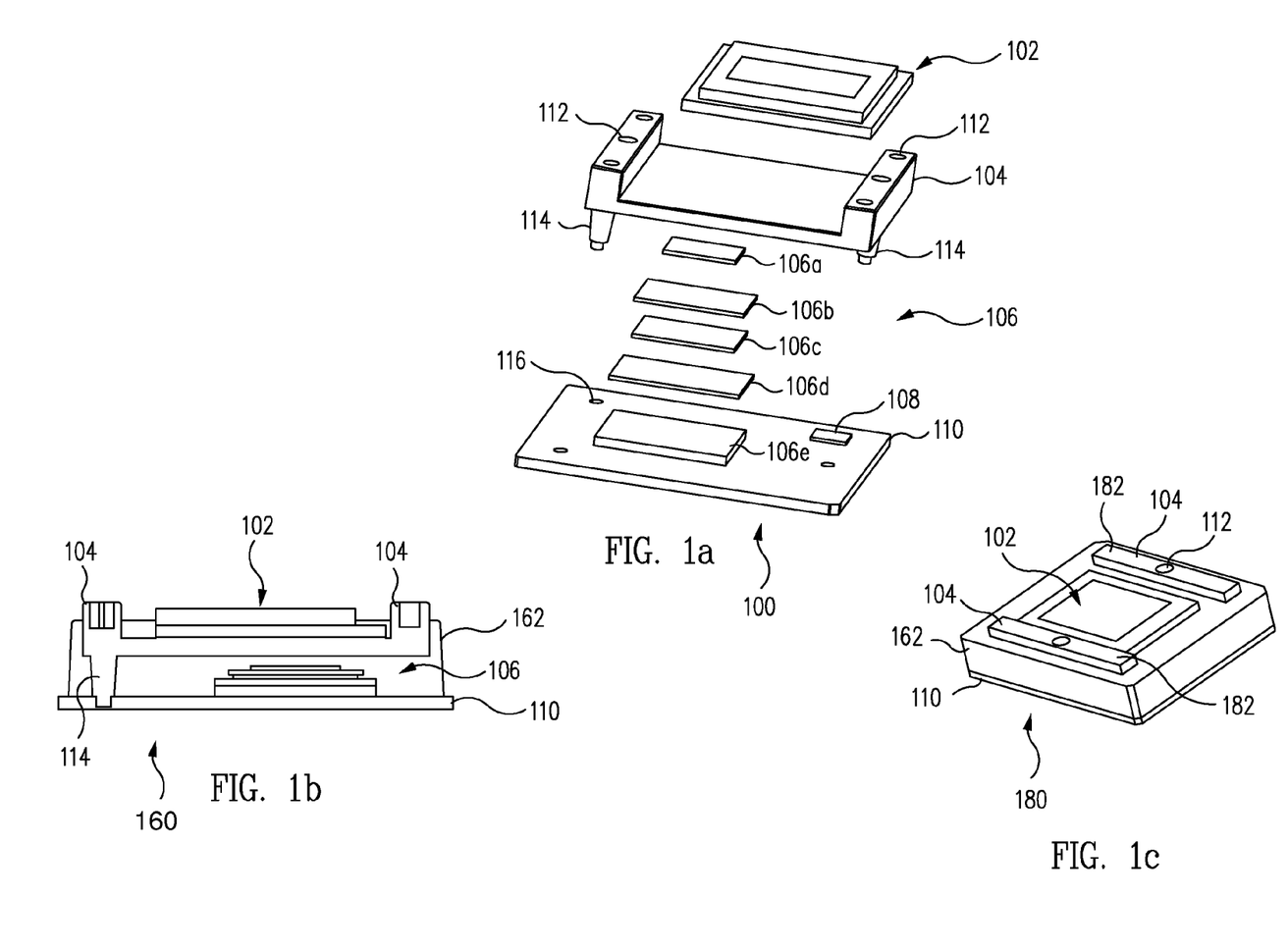
FIGS. 1a-1c show diagrams illustrating infrared camera architectures in accordance with one or more embodiments of the invention.

FIGS. 1a-1c illustrate infrared camera architectures 100, 160, and 180, respectively, in accordance with one or more embodiments of the invention. Infrared (IR) camera architecture 100, shown in an exploded view in FIG. 1a, includes an IR detector 102, a pedestal 104, a die stack 106, and a substrate 110. IR camera architecture 100 may represent, for example in accordance with one or more embodiments, an IR camera or an IR camera core that may be incorporated into an IR camera (e.g., an IR camera system).

IR detector 102, for example, represents any type of IR detector or IR detector package (e.g., a focal plane array (FPA) or vacuum package assembly (VPA), such as a wafer level package (WLP) VPA). IR detector 102 may be wire bonded (e.g., reverse wire bonding, wedge bonding, or forward wire bonding) or otherwise electrically connected, for example, to die stack 106 and/or substrate 110. As a specific example, IR detector 102 may be reverse wire bonded between pads of IR detector 102 and substrate pads of substrate 110.

IR detector 102 may be secured to pedestal 104, in accordance with an embodiment of the invention, with a low stress adhesive. For example, Zymet TC-601.1 adhesive (made by Zymet, Inc. of East Hanover, N.J.) may be used to adhere IR detector 102 to pedestal 104 and provide a low stress bond that may reduce thermal expansion coefficient (CTE) mismatch issues between IR detector 102 (e.g., silicon) and pedestal 104 (e.g., copper). As a specific example, the adhesive may substantially match the CTE of pedestal 104 and IR detector 102, reduce stress on IR detector 102 (e.g., to IR window solder joints of IR detector 102), and reduce warping of IR detector 102 due to stresses (e.g., which may reduce image anomalies and other artifacts).

Pedestal 104 supports IR detector 102 above substrate 110 by using legs 114 (e.g., any number of legs 114, such as three or four) couplable to substrate 110. For example, legs 114 may be secured using adhesive to corresponding portions 116 (e.g., holes, depressions, or pads) of substrate 110. Pedestal 104, with legs 114, provides adequate space for thermal isolation (e.g., to set apart and/or shield to provide some degree of protection from thermal energy) of IR detector 102 from die stack 106. For example for one or more embodiments, pedestal 104 may provide thermal isolation of IR detector 102 from die stack 106 (or other thermal energy sources within IR camera architecture 100) by providing sufficient spacing from the undesired thermal energy to provide some degree of shielding or protection for IR detector 102 from the undesired thermal energy.

Pedestal 104 may be made, for example, of copper formed by metal injection molding (MIM) and provided with a black oxide or nickel-coated finish. Alternatively, pedestal 104 may be made of any desired material, such as for example zinc, aluminum, or magnesium, as desired for a given application and may be formed by any desired applicable process, such as for example aluminum casting, MIM, or zinc rapid casting, for the given application.

Die stack 106, for example, represents various die, chip packages, or other forms of electrical circuits coupled to substrate 110. As a specific example, die stack 106 may represent an application specific integrated circuit (ASIC, e.g., a mixed signal ASIC) die 106a, a memory die 106b (e.g., a flash memory, such as a serial flash memory), an optional spacer 106c (e.g., a silicon spacer), a memory die 106d (e.g., a DRAM), and an ASIC 106e (e.g., a logic die).

Die stack 106 may be stacked (e.g., three-dimensional (3D) stack) and secured and electrically coupled to substrate 110, as would be understood by one skilled in the art. Various other electrical components (e.g., passive and/or active components), such as for example capacitors, inductors, resistors, and/or dies (e.g., a power management IC 108) also may be secured and/or electrically coupled to substrate 110, as needed for a desired application. As a specific example, power management IC (PMIC) 108 may represent a power die or chip that receives 3.3 volts (e.g., a power supply voltage such as from a battery or other external power source) and provides various voltages required (e.g., 1.2, 1.8, and 2.5 volts) for IR camera architecture 100. Consequently, IR camera architecture 100, in accordance with an embodiment, may receive 3.3 volts from and provide IR thermal image data to an IR camera system incorporating IR camera architecture 100.

Figure 2:
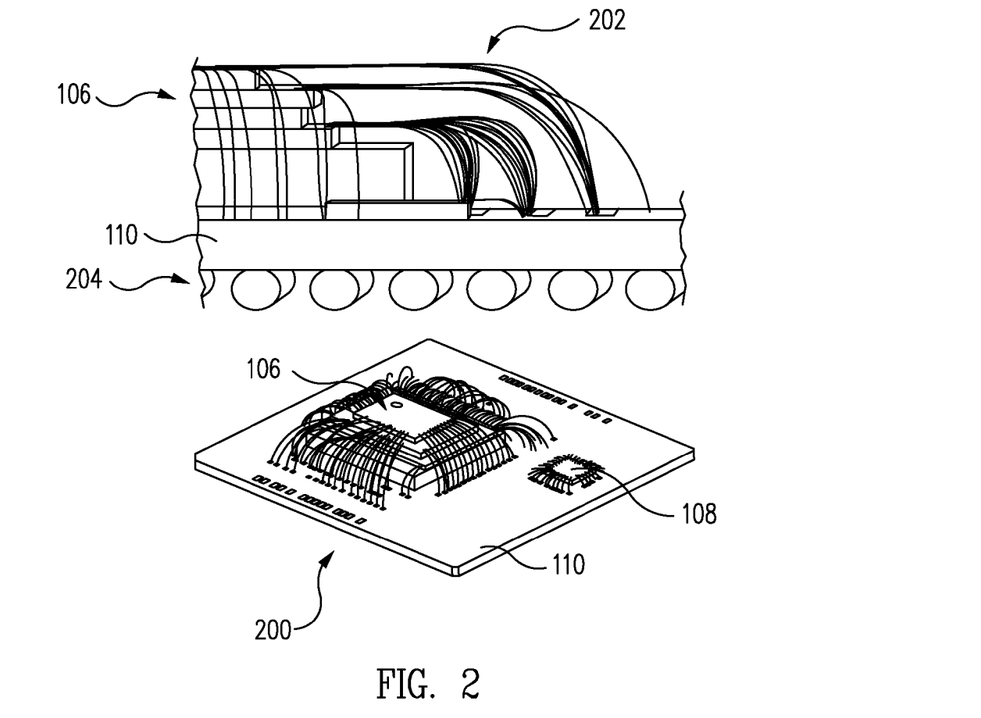
FIG. 2 shows a diagram illustrating an example for bonding various elements within the infrared camera architecture in accordance with an embodiment of the invention.

As a specific example, referring briefly to FIG. 2, die stack 106, in accordance with an embodiment of the invention, may be wire bonded 202 to each other and/or to substrate 110, as shown in the perspective view and magnified side view. PMIC 108 may also be wire bonded or otherwise electrically coupled to substrate 110, as shown in FIG. 2.

ASIC 106e (e.g., a logic die) may be coupled to substrate 110, as an example, using flip chip technology, and substrate 110 may be configured with solder balls 204 using ball grid array (BGA) technology to form electrical connections, as shown in the magnified view of FIG. 2. In general, substrate 110 may represent any type of substrate (e.g., a printed circuit board (PCB), which may be made of, for example, a bismaleimide triazine (BT) substrate, a ceramic, and/or other conventional materials.

FIG. 1b illustrates an IR camera architecture 160, which may represent a cross-sectional, side-elevational view of IR camera architecture 100 (FIG. 1a), in accordance with an embodiment of the invention. IR camera architecture 160 shows a portion of IR detector 102, pedestal 104, and die stack 106 encapsulated within a housing 162. For example, after IR camera architecture 100 is completely assembled, a mold may be placed on substrate 110 and liquid epoxy may be injected into the mold, which hardens to form housing 162 (e.g., a hardened, liquid epoxy housing), as would be understood by one skilled in the art. For example for one or more embodiments, the liquid epoxy may cover substrate 110, die stack 106, and/or fill in various recesses of IR camera architecture 160. In a specific implementation example, the liquid epoxy fills in and hardens to cover substrate 110, die stack 106, and various recesses of IR camera architecture 160.

The mold may be designed such that the liquid epoxy does not cover IR detector 102 or otherwise interfere or block IR energy from reaching IR detector 102 (e.g., through an IR window of the VPA). For example, FIG. 1c illustrates an IR camera architecture 180, which may represent a top, perspective view of IR camera architecture 100 (FIG. 1a) or IR camera architecture 160 (FIG. 1b), in accordance with an embodiment of the invention. As shown, a top portion of IR detector 102 is exposed and not covered by housing 162 to allow IR energy to reach IR detector 102. Also, a portion of pedestal 104 (e.g., side rails 182) may also be exposed and not covered by housing 162.

Figure 3:
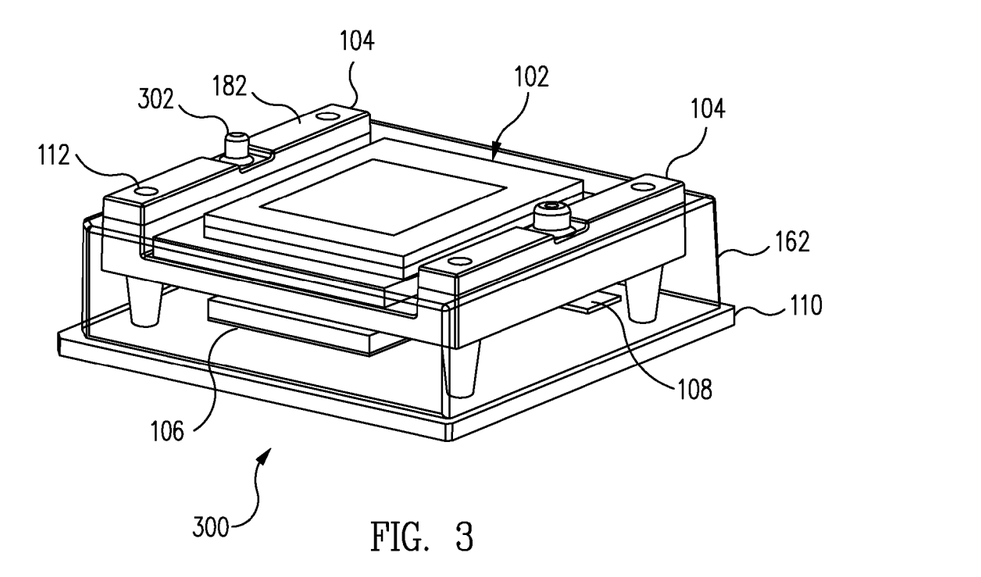
FIG. 3 shows a perspective view diagram illustrating an infrared camera architecture in accordance with an embodiment of the invention.

Pedestal 104 may have one or more alignment indents 112 (e.g., alignment features) in accordance with one or more embodiments of the invention. For example, six alignment indents 112 are shown in pedestal 104 of IR camera architecture 100 (FIG. 1a), while two alignment indents 112 are shown in pedestal 104 of IR camera architecture 180 (FIG. 1c). Pedestal 104 may also have one or more alignment tabs 302 (e.g., alignment protrusions, features, datums, or marks), in accordance with one or more embodiments of the invention, such as illustrated in FIG. 3 for an IR camera architecture 300.

IR camera architecture 300 may represent an alternative embodiment of IR camera architectures 100 (FIG. 1a), 160 (FIG. 1b), or 180 (FIG. 1c). IR camera architecture 300 may include four legs 114, four alignment indents 112, and two alignment tabs 302. Alignment indents 112 and/or alignment tabs 302 may be used to align IR camera architecture 300 and properly position it into an infrared camera system. For example, alignment indents 112 may correspond with alignment tabs on a housing of the infrared camera system and/or alignment tabs 302 may correspond with alignment indents on the housing of the infrared camera system to align IR camera architecture 300 within the housing of the infrared camera system.

In general, pedestal 104 may provide certain advantageous features for the IR camera architecture (e.g., FIGS. 1a-3), in accordance with one or more embodiments of the invention. For example for an embodiment, pedestal 104 may provide optical alignment of the IR camera architecture within an infrared camera system, such as with the use of alignment features (e.g., indents 112 and/or alignment tabs 302). As another example for an embodiment, pedestal 104 may provide heat dissipation and heat spreading in a beneficial fashion, such as for IR detector 102. As another example for an embodiment, pedestal 104 may provide space for heat isolation, such as for example to isolate IR detector 102 from unwanted heat from die stack 106 (e.g., to provide some degree of thermal protection for IR detector 102 from die stack 106).

Figure 4:
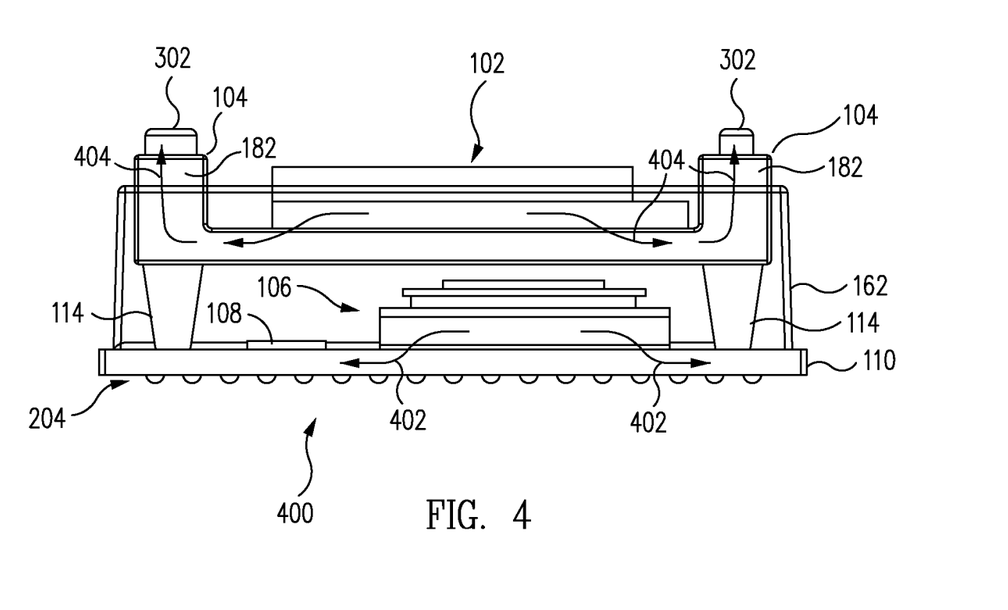
FIG. 4 shows a side view diagram illustrating an example of thermal paths for an infrared camera architecture in accordance with an embodiment of the invention.

As a specific example, FIG. 4 shows a side view diagram illustrating an example of thermal paths for an IR camera architecture 400 in accordance with an embodiment of the invention. IR camera architecture 400 may represent an example embodiment of an IR camera architecture (e.g., such as described in reference to FIGS. 1a-3). As shown, thermal paths 402 illustrate the thermal connection between die stack 106 and substrate 110, allowing the dissipation of heat, such as through substrate 110 and through solder balls 204 (e.g., BGA balls or other types of electrical connections).

Similarly, thermal paths 404 illustrate the thermal connection between IR detector 102 and pedestal 104, allowing the spreading and dissipation of heat, such as through pedestal 104 and via the top portion of pedestal 104 (e.g., side rails 182 having alignment tabs 302) and possibly to other portions (e.g., optics) of an infrared camera system incorporating IR camera architecture 400. Pedestal 104 may provide a high thermally conductive structure to maintain good thermal contact with IR detector 102 (e.g., and also to a housing and associated optics), dissipate localized heat rapidly under IR detector 102, and improve thermal uniformity under IR detector 102. As noted, pedestal 104 also provides a spacing above die stack 106 and other electrical components (e.g., PMIC 108) on substrate 110 to provide thermal isolation for IR detector 102.

Figure 5:
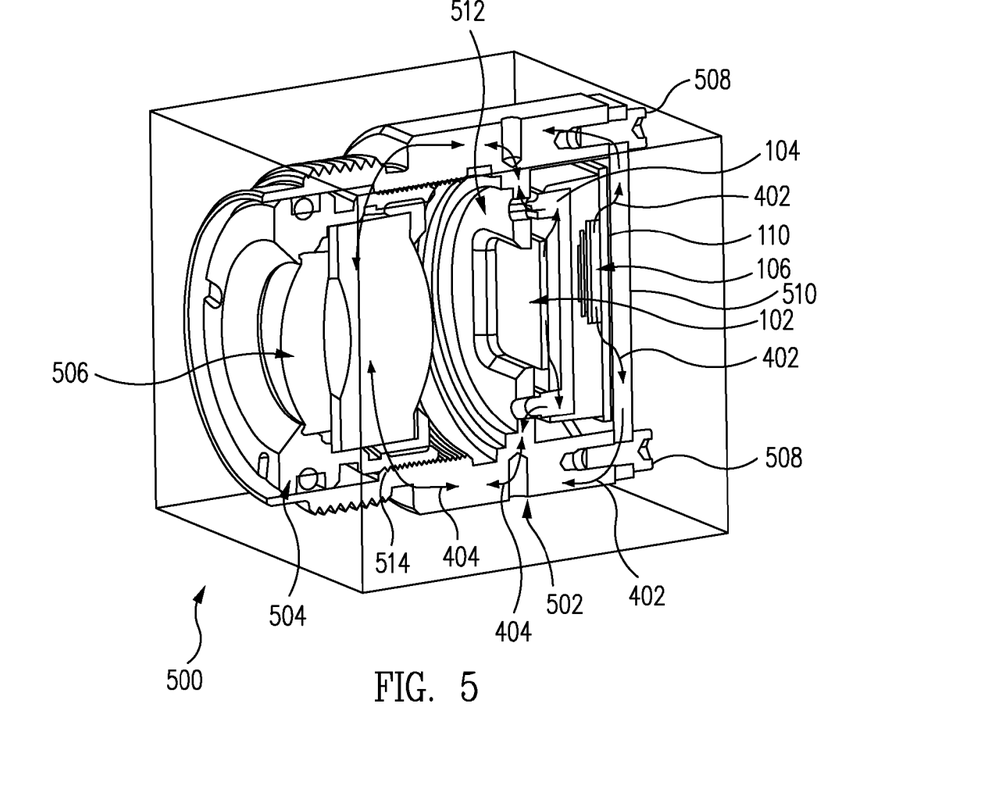
FIG. 5 shows a perspective, cross-sectional view diagram illustrating an infrared camera architecture in accordance with an embodiment of the invention.

FIG. 5 provides a perspective, cross-sectional view illustrating an IR camera architecture 500 in accordance with an embodiment of the invention. IR camera architecture 500 (e.g., an IR camera or IR camera system) includes a housing 502 (e.g., an enclosure), an optics housing 504 that contains one or more lens 506, and a rear cover 510. As shown, optics housing 504 may engage threads 514 or be secured within housing 502 by other conventional techniques to be properly positioned relative to IR detector 102, in accordance with one or more embodiments.

Rear cover 510 is secured to housing 502 via fasteners 508 (e.g., screws, bolts, or other types of fasteners) and encloses an IR camera architecture (e.g., IR camera architecture 300) within housing 502. In accordance with one or more embodiments, rear cover 510 may be a camera board (e.g., a PCB) with associated electrical components to support and interface with substrate 110. For example, rear cover 510 may include electrical connections to couple with electrical connections of substrate 110 (e.g., solder bumps to couple with solder balls 204 (FIG. 2)) and may include electrical components (e.g., passive and/or active components), such as for example capacitors, inductors, resistors, and/or dies, as needed for a desired application as would be understood by one skilled in the art.

Thermal paths 402 and 404 are shown and illustrate the thermal routes within IR camera architecture 500. For example, thermal paths 402 are shown from die stack 106, through substrate 110, rear cover 510, and fasteners 508, to housing 502. Furthermore, thermal paths 404 are shown from IR detector 102, through pedestal 104 and partial divider 512, to housing 502 and on through lens 506. Therefore, pedestal 104 provides for temperature coupling of the IR detector 102 with the optics (e.g., lens 506) via pedestal 104 and further provides for temperature uniformity under IR detector 102 (e.g., along readout circuitry of IR detector 102 due to pedestal 104 made of a high thermally conductive material), in accordance with one or more embodiments.

Figure 6A:
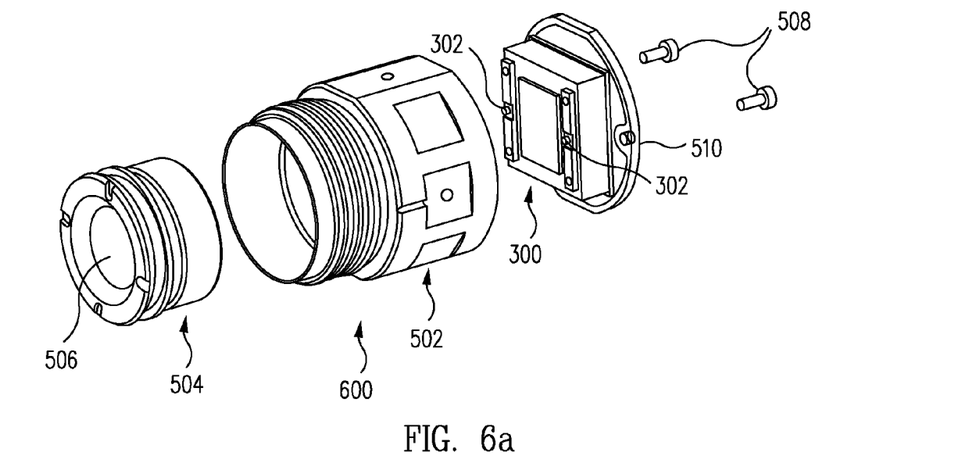
FIGS. 6a and 6b show exploded, perspective view diagrams illustrating an infrared camera architecture in accordance with an embodiment of the invention.
Figure 6B:
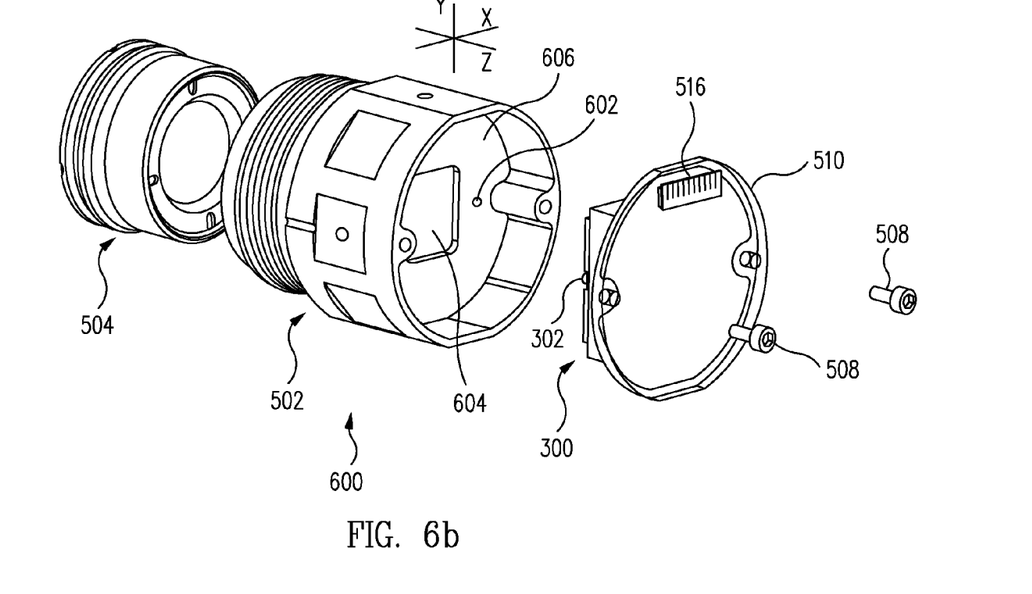

FIGS. 6a and 6b provide exploded, perspective views illustrating an IR camera architecture 600 in accordance with an embodiment of the invention. IR camera architecture 600 (e.g., an IR camera system) is similar to IR camera architecture 500 (FIG. 5), but further illustrates the use of optical X, Y, and/or Z datums (e.g., alignment features) to align and properly position an IR camera architecture, such as IR camera architecture 300, within housing 502 and relative to lens 506 within optics housing 504.

Specifically, in accordance with an embodiment, housing 502 includes alignment indents 602 that correspond with alignment tabs 302 on pedestal 104 (e.g., corresponding alignment datums). Consequently, when alignment tabs 302 are inserted into alignment indents 602, IR detector 102 of IR camera architecture 300 will be properly positioned within housing 502 to receive IR energy through lens 506 via an opening 604 within housing 502 when optics housing 504 is properly positioned within housing 502. As a specific example for an embodiment, alignment tabs 302 couple with alignment indents 602 (e.g., to at least provide proper X and Y positioning and possibly Z positioning) and side rails 182 couple with (e.g., abut) an inner surface 606 of IR camera architecture 600 (e.g., to provide proper Z positioning relative to the example XYZ coordinate system shown), such that IR camera architecture 300 is properly positioned within housing 502.

As shown in FIG. 6b, rear cover 510 (e.g., a PCB electrically coupled to substrate 110) may include an interface connector 516 to provide an interface through which power, command and control, and/or other electrical signals may be provided to IR camera architecture 600 and through which IR thermal image data and/or other electrical signals may be received from IR camera architecture 600. Consequently, IR camera architecture 600 may be easily incorporated into an IR camera system.

Figure 7A:
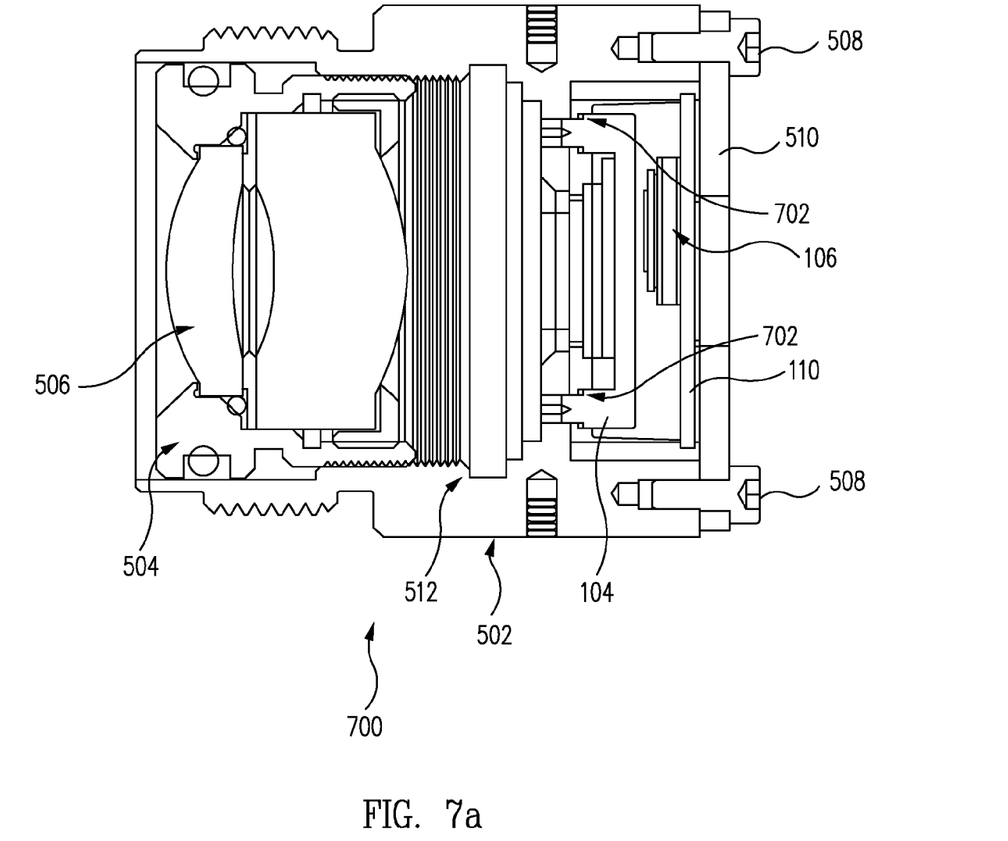
FIGS. 7a and 7b show cross-sectional, side view diagrams illustrating infrared camera architectures in accordance with one or more embodiments of the invention.
Figure 7B:
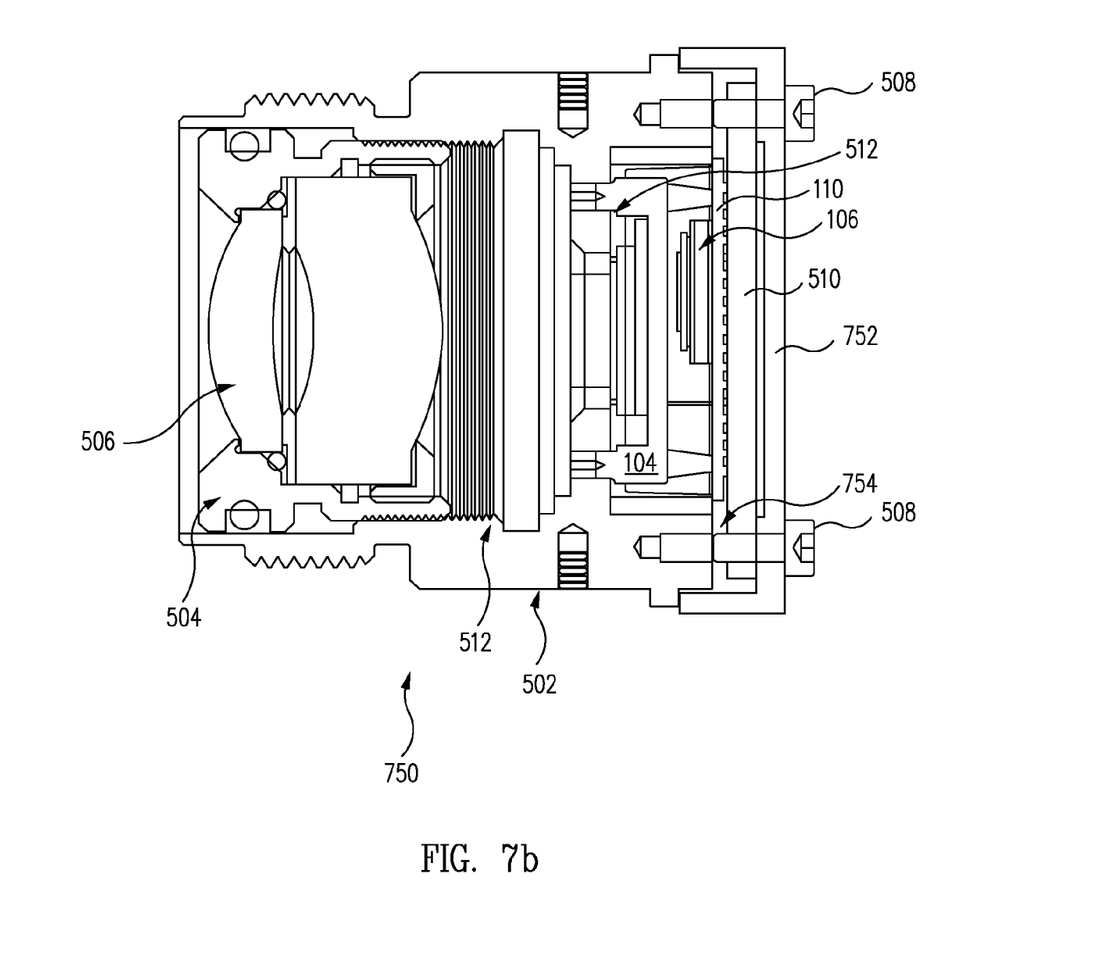

FIGS. 7a and 7b provide cross-sectional, side views illustrating IR camera architectures 700 and 750, respectively, in accordance with one or more embodiments of the invention. IR camera architectures 700 and 750 are similar to IR camera architectures 500 (FIG. 5) and 600 (FIG. 6), but illustrate certain alternative or additional features in accordance with one or more embodiments.

IR camera architecture 700 illustrates rear cover 510 coupled to substrate 110 of the IR camera architecture (e.g., IR camera architecture 300) and secured to housing 502 by fasteners 508. A thermal pad 702 may be disposed between pedestal 104 and partial divider 512 (e.g., a portion of the optics barrel), as shown in FIG. 7a.

IR camera architecture 750 illustrates a thermal pad 754 disposed between substrate 110 and rear cover 510. A housing cover 752 and fasteners 508 enclose the IR camera architecture (e.g., IR camera architecture 300) within housing 502, while pedestal 104 directly contacts partial divider 512 (e.g., a portion of the optics barrel), as shown in FIG. 7b.

In accordance with one or more embodiments, infrared camera architectures (e.g., as discussed in reference to FIGS. 1a-4) are disclosed, which may provide certain advantages over conventional infrared camera architectures. For example, the infrared camera architecture may be viewed as and represent a single IR camera package (e.g., a one chip IR camera core architecture or a single IR camera core) that may operate as an uncooled IR camera core that requires minimal external support circuitry (e.g., 3.3 volts in, IR image data out).

The IR camera architecture, for example, may include a pedestal that supports an IR detector and provides adequate space for thermal isolation between the IR detector and the associated electronics below the pedestal. The associated electronics may include a die stack (e.g., chip stack or heat sink chip/die stack) and possibly other electrical components (e.g., discrete capacitors, inductors, resistors, and/or chips, such as a power management chip) such that the IR detector and the associated electronics are merged within a single core package (e.g., encapsulated within a plastic overmold with optical alignment tabs/indents on the pedestal and an unobstructed IR detector window).

The pedestal, for one or more embodiments, may provide optical alignment, heat dissipation, and heat spreading to aid the IR detector's functionality. The pedestal may also provide sufficient space to thermally isolate the IR detector from the associated electronics on the substrate below the pedestal.

Furthermore, the pedestal may thermally link the IR detector with associated optics, in accordance with one or more embodiments. For example, as discussed in reference to FIGS. 4-7b, the IR camera architecture may be thermally coupled within an IR camera (e.g., IR camera architectures 500, 600, 700, or 750) to thermally link the IR detector to the IR camera's optics and housing and further thermally link and dissipate and spread heat from the associated electronics (e.g., via the substrate and/or BOA) to the IR camera housing and optics, which may provide a thermally uniform and stable architecture.

Figure 8:
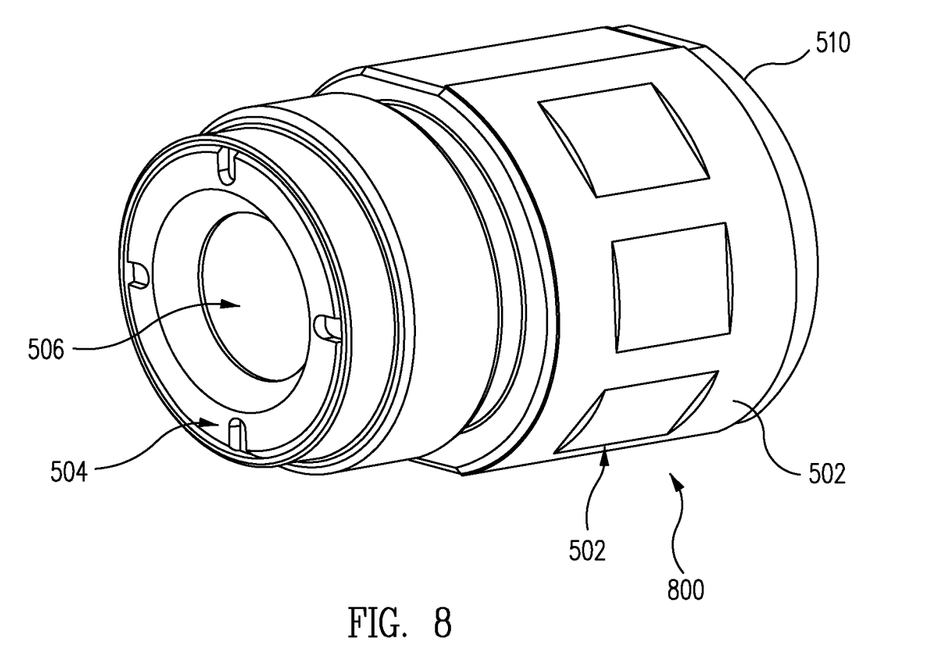
FIG. 8 shows a perspective view diagram illustrating an infrared camera architecture in accordance with an embodiment of the invention.

FIG. 8 provides a perspective view illustrating an assembled IR camera 800 in accordance with an embodiment of the invention. IR camera 800 may include an IR camera architecture, such as IR camera architecture 100, 160, 180, 300, or 400 (e.g., as discussed in reference to FIGS. 1-4) and may further represent an IR camera architecture similar to IR camera architectures 500, 600, 700, and 750 (e.g., as discussed in reference to FIGS. 5-7h). In general, IR camera 800 may be self contained and easily implemented within a system requiring IR imaging capability.

Figure 9:
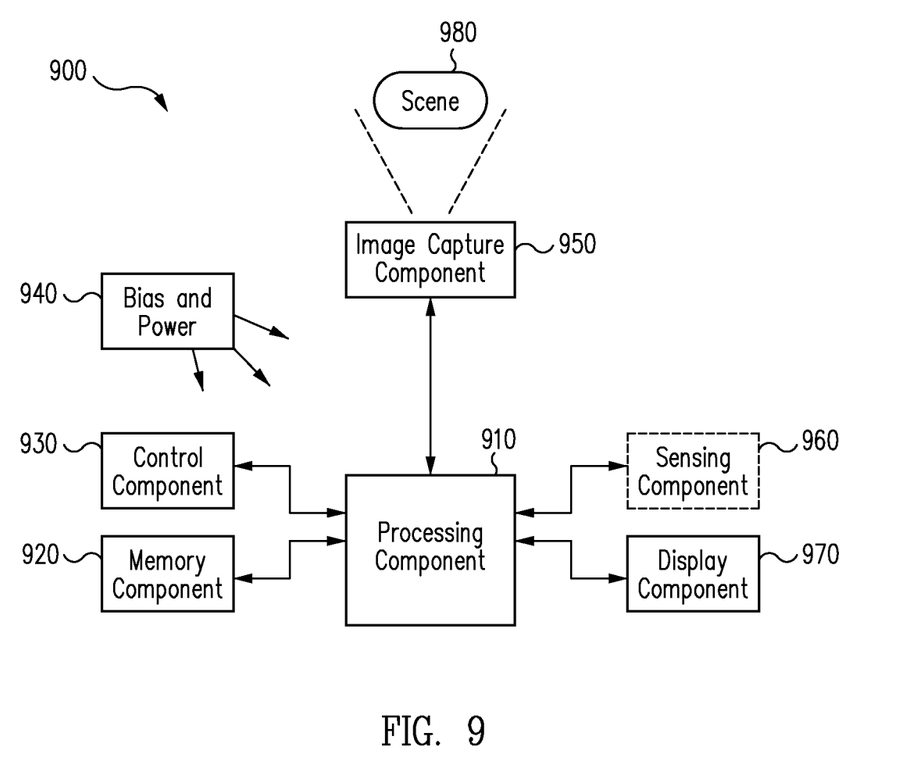
FIG. 9 shows a block diagram illustrating an infrared camera system in accordance with one or more embodiments of the invention.

FIG. 9 provides a block diagram illustrating a system 900 (e.g., an IR camera or IR camera system), which is configured to capture and process IR images, in accordance with one or more embodiments of the invention. System 900 may represent an IR camera system, which includes one of the IR camera architectures disclosed herein.

System 900 comprises, in one implementation, a processing component 910, a memory component 920, a control component 930, a power component 940, an image capture component 950, and a display component 970. Optionally, system 900 may include a sensing component 960.

System 900 may represent for example an infrared imaging device, such as an infrared camera (e.g., an infrared camera system), to capture and process images, such as still or video IR images of a scene 980. System 900 includes at least one of the IR camera architectures disclosed herein (e.g., IR camera architecture 100 or IR camera architecture 500), with the IR camera architecture represented by various portions of system 900.

For example, the IR camera architecture may be represented by image capture component 950 (e.g., IR detector 102), power component 940 (e.g., ASIC 106a and/or PMIC 108), memory component 920 (e.g., within die stack 106, such as memory die 106b and 106d), and processing component 910 (e.g., within die stack 106, such as ASIC 106a and/or 106e of FIG. 1a). System 900 may, for example, include further functionality in addition to what is represented by IR camera architecture, for the above example. For example, there may be additional memory and processing functionality (e.g., additional portions of memory component 920, power component 940, and processing component 910) within system 900 that is not included within the IR camera architecture.

As a specific example, system 900 may represent a distributed network system with one or more IR camera architectures that are networked to a computer (e.g., a server) to receive the IR image data and store, display, and/or further process the IR image data. System 900 may also comprise, for example, a portable device and may be incorporated, e.g., into a vehicle (e.g., an automobile or other type of land-based vehicle, an aircraft, a marine craft, or a spacecraft) or a non-mobile installation requiring infrared images (e.g., IR image data) to be stored and/or displayed.

In accordance with one or more embodiments, processing component 910 may comprise any type of a processor or a logic device (e.g., a programmable logic device (PLD) or ASIC configured to perform processing functions). Processing component 910 may be adapted to interface and communicate with components 920, 930, 940, 950, and 970 to perform method and processing steps and/or operations, as would be understood by one skilled in the art.

Memory component 920 comprises, in accordance with an embodiment, one or more memory devices adapted to store data and information, including for example infrared data and information. Memory device 920 may comprise one or more various types of memory devices including volatile and nonvolatile memory devices. Processing component 910 may be adapted to execute software or be configured by a bit stream stored in memory component 920 so as to perform method and process steps and/or operations described herein.

Image capture component 950 comprises, in accordance with an embodiment, any type of infrared image sensor, such as for example one or more infrared sensors (e.g., any type of multi-pixel infrared detector, such as a focal plane array) for capturing infrared image data (e.g., still image data and/or video data) representative of an image, such as scene 980. In one example implementation, the infrared sensors of image capture component 950 provide for representing (e.g., converting) the captured image data as digital data (e.g., via an analog-to-digital converter included as part of the infrared sensor or separate from the infrared sensor as part of system 900).

In accordance with an embodiment, the infrared image data (e.g., infrared video data) may comprise non-uniform data (e.g., real image data) of an image, such as scene 980. Processing component 910 may be adapted to process the infrared image data (e.g., to provide processed image data), store the infrared image data in memory component 920, and/or retrieve stored infrared image data from memory component 920. For example, processing component 910 may be adapted to process infrared image data stored in memory component 920 to provide processed image data and information (e.g., captured and/or processed infrared image data).

Control component 930 comprises, in accordance with an embodiment, a user input and/or interface device that is adapted to generate a user input control signal. For example, the user input and/or interface device may include a rotatable knob (e.g., a potentiometer), push buttons, a slide bar, a keyboard, and the like. Processing component 910 may be adapted to sense control input signals from a user via control component 930 and respond to any sensed control input signals received therefrom. Processing component 910 may be adapted to interpret such a control input signal as a parameter value, as generally understood by one skilled in the art.

In accordance with an embodiment, control component 930 may comprise a control unit (e.g., a wired or wireless handheld control unit) having push buttons adapted to interface with a user and receive user input control values. In one implementation, the push buttons of the control unit may be used to control various functions of the system 900, such as autofocus, menu enable and selection, field of view, brightness, contrast, noise filtering, high pass filtering, low pass filtering, and/or various other features as understood by one skilled in the art.

Power component 940, in accordance with an embodiment, provides various power supply voltages (e.g., reference voltages, bias voltages, reference currents, or other desired bias and power signals) required by the IR camera architecture and optionally for the entire system 900, depending upon the specific application and requirements. As a specific example, power component 940 may represent PMIC 108 of FIG. 1a, in accordance with an embodiment, and system 900 may further include additional power supply sources.

Display component 970 comprises, in accordance with an embodiment, an image display device (e.g., a liquid crystal display (LCD) or various other types of generally known video displays or monitors). Processing component 910 may be adapted to display image data and information on display component 970. Processing component 910 may be adapted to retrieve image data and information from memory component 920 and display any retrieved image data and information on display component 970. Display component 970 may comprise display electronics, which may be utilized by processing component 910 to display image data and information (e.g., infrared images). Display component 970 may be adapted to receive image data and information directly from image capture component 950 via the processing component 910, or the image data and information may be transferred from memory component 920 (e.g., via processing component 910).

Optional sensing component 960 comprises, in accordance with an embodiment, one or more sensors of various types, depending on the application or implementation requirements, as would be understood by one skilled in the art. The sensors of optional sensing component 960 provide data and/or information to at least processing component 910. In one aspect, processing component 910 may be adapted to communicate with sensing component 960 (e.g., by receiving sensor information from sensing component 960) and with image capture component 950 (e.g., by receiving data and information from image capture component 950 and providing and/or receiving command, control, and/or other information to and/or from one or more other components of system 900).

In various implementations, sensing component 960 may provide information regarding environmental conditions, such as outside temperature, lighting conditions (e.g., day, night, dusk, and/or dawn), humidity level, specific weather conditions (e.g., sun, rain, and/or snow), distance (e.g., via a laser rangefinder), and/or whether a tunnel or other type of enclosure has been entered or exited. Sensing component 960 may represent conventional sensors as generally known by one skilled in the art for monitoring various conditions (e.g., environmental conditions) that may have an effect (e.g., on the image appearance) on the data provided by image capture component 950.

In some implementations, optional sensing component 960 (e.g., one or more of sensors) may comprise devices that relay information to processing component 910 via wired and/or wireless communication. For example, optional sensing component 960 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques.

In accordance with one or more embodiments, components of system 900 may be combined and/or implemented or not, as desired or depending on the application or requirements, with system 900 representing various functional blocks of a related system. In one example, processing component 910 may be combined with memory component 920, image capture component 950, display component 970, and/or optional sensing component 960. In another example, processing component 910 may be combined with image capture component 950 with only certain functions of processing component 910 performed by circuitry (e.g., a processor, a microprocessor, a logic device, a microcontroller, etc.) within image capture component 950. Furthermore, various components of system 900 may be remote from each other (e.g., image capture component 950 may comprise a remote sensor with processing component 910, etc. representing a computer that may or may not be in communication with image capture component 950).

Systems and methods are disclosed herein to provide infrared camera architectures in accordance with one or more embodiments of the invention. For example, in accordance with an embodiment of the invention, an infrared camera architecture is disclosed that integrates the entire IR camera electronics, thermal management, and optical alignment functionality into a single component (e.g., a single package or chip core). The infrared camera architecture, for example, may represent an easy to design-in electronic component for device and system applications.

The infrared camera architectures disclosed herein may provide certain advantages over conventional infrared camera architectures. For example, the techniques disclosed herein for one or more embodiments of the invention may provide for greater miniaturization of the infrared camera and at reduced manufacturing costs and allow for higher volume production. The infrared camera architectures may reduce the number of external circuit boards, components, heat sinks, packages, and additional electronic circuitry and power supply voltages that would conventionally be required to create and support the infrared camera. The infrared camera architectures further may reduce, simplify, or eliminate complex calibration procedures, thermal management, and optical alignment requirements and thus, provide an infrared camera that may be easily incorporated into and supported for a desired application.

While the invention has been described in detail in connection with only a limited number of embodiments of the invention, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected is:

1. An infrared camera, comprising:
   an infrared detector comprising a focal plane array adapted to capture infrared images;
   a substrate;
   a plurality of electrical components coupled to the substrate; and
   a pedestal made of a thermally conductive material and coupled to the substrate, wherein the infrared detector is supported by and thermally coupled to the pedestal, the pedestal thermally isolating the infrared detector from the plurality of electrical components and providing thermal uniformity across the focal plane array of the infrared detector.

2. The infrared camera of claim 1, wherein the pedestal is made of copper, has at least one leg coupled to the substrate, and provides heat dissipation and heat spreading to maintain a substantially thermally uniform surface for coupling to the infrared detector, and wherein the infrared camera comprises:
   an adhesive disposed between the infrared detector and the pedestal to couple the infrared detector to the pedestal and to reduce thermal expansion coefficient mismatch between the pedestal and the infrared detector.

3. The infrared camera of claim 1, further comprising a core housing coupled to and in contact with the substrate and the pedestal, wherein:
   the infrared detector comprises a wafer level package vacuum package assembly electrically coupled to the substrate and/or to the plurality of electrical components;
   the core housing comprises a hardened liquid epoxy configured to encapsulate the plurality of electrical components and at least partially the infrared detector, the substrate, and/or the pedestal; and
   the core housing, the infrared detector, the substrate, the pedestal, and the plurality of electrical components form an infrared camera core.

4. The infrared camera of claim 1, wherein the plurality of electrical components comprises:
   a die stack having a logic die and a memory die adapted to support the infrared detector; and
   a power management device adapted to receive a power supply voltage and provide all required voltages for the infrared detector and/or the electrical components, wherein the infrared camera is configured to receive the power supply voltage and provide infrared image data.

5. The infrared camera of claim 4, wherein the logic die is coupled to the substrate using flip chip and/or wire bond technology.

6. The infrared camera of claim 1, wherein the pedestal comprises a black oxide and/or a nickel coated finish.

7. The infrared camera of claim 1, further comprising:
   a camera housing; and
   a lens within the camera housing, wherein the infrared detector, the substrate, the pedestal, and the plurality of electrical components are disposed substantially within the camera housing, the pedestal comprises a side rail disposed adjacent a side of the infrared detector, and the pedestal comprises an alignment feature, formed in, on, or of a top surface of the side rail of the pedestal, corresponding to an alignment feature within the camera housing to provide optical alignment of the infrared detector with the lens.

8. The infrared camera of claim 1, further comprising:
   a camera housing; and
   a lens within the camera housing, wherein the infrared detector, the substrate, the pedestal, and the plurality of electrical components are disposed substantially within the camera housing, and the pedestal is configured to provide a first thermal path between the infrared detector, the camera housing, and the lens.

9. The infrared camera of claim 8, further comprising a rear cover coupled to the camera housing and having an electrical interface connector, wherein the substrate is configured to provide a second thermal path from the plurality of electrical components to the rear cover, and wherein the rear cover is configured to thermally couple the second thermal path to the camera housing.

10. A method for assembling the infrared camera of claim 1, the method comprising:
    coupling the infrared detector to the pedestal;
    mounting at least one of the plurality of electrical components to the substrate; and
    coupling the pedestal to the substrate and above the at least one of the plurality of electrical components.

11. An infrared camera, comprising:
    an infrared detector comprising a focal plane array adapted to capture infrared images;
    a pedestal thermally coupled to the infrared detector and providing thermal uniformity across the focal plane array of the infrared detector, the pedestal having an infrared detector alignment feature formed in, on, or of a top surface of the pedestal;
    a substrate coupled to the pedestal;
    a die stack coupled to the substrate, wherein the pedestal is configured to thermally protect the infrared detector from the die stack;
    a camera housing having an optical alignment feature within the camera housing and at least partially enclosing the infrared detector, the pedestal, the substrate, and the die stack; and
    a lens within the camera housing;

wherein the optical alignment feature and the infrared detector alignment feature are coupled to provide optical alignment of the infrared detector with the lens.

12. The infrared camera of claim 11, wherein the pedestal is made of a thermally conductive material and is coupled to the infrared detector with an adhesive to reduce thermal expansion coefficient mismatch between the pedestal and the infrared detector, the pedestal adapted to provide heat dissipation and heat spreading to maintain a substantially thermally uniform surface for coupling to the infrared detector, and wherein the infrared detector is electrically coupled to the die stack and/or the substrate.

13. The infrared camera of claim 11, further comprising an infrared camera core housing configured to at least partially house the infrared detector, the pedestal, the substrate, and the die stack to form an infrared camera core, wherein the infrared detector comprises a wafer level package vacuum package assembly, the infrared camera core housing comprises a hardened liquid epoxy that encapsulates the die stack and leaves unobstructed the infrared detector alignment feature and an opening through which the infrared detector receives infrared energy via the lens, and the infrared camera core comprises an uncooled infrared camera core.

14. The infrared camera of claim 11, further comprising a power management circuit coupled to the substrate, wherein the pedestal is configured to thermally protect the infrared detector from the power management circuit, the power management circuit is adapted to receive a power supply voltage and provide one or more voltages for the infrared detector and/or the die stack, and the infrared detector and/or the die stack are configured to provide infrared image data.

15. The infrared camera of claim 11, wherein the pedestal is configured to provide a first thermal path between the infrared detector, the camera housing, and the lens, and wherein the substrate and the camera housing are configured to form a second thermal path between the die stack and the camera housing.

16. The infrared camera of claim 15, wherein the camera housing has a rear cover thermally coupled to the substrate to form the second thermal path, the rear cover having an electrical interface connector configured to provide infrared image data based on the captured infrared images and receive a power supply voltage.

17. A method of assembling an infrared camera, the method comprising:
mounting a die stack to a substrate;
coupling an infrared detector to a pedestal, wherein the pedestal is made of a thermally conductive material, and wherein the infrared detector comprises a focal plane array adapted to capture infrared images and is supported by and thermally coupled to the pedestal; and
coupling the pedestal to the substrate and above the die stack, wherein the pedestal is configured to thermally isolate the infrared detector from the die stack and provide thermal uniformity across the focal plane array of the infrared detector.

18. The method of claim 17, comprising:
installing an optics housing having at least one lens into an infrared camera housing;
aligning the infrared detector within the infrared camera housing by matching a first alignment feature formed in, on, or of a top surface of the pedestal with a second alignment feature within the infrared camera housing to position the infrared detector relative to the at least one lens; and
securing the infrared detector and/or the pedestal within the infrared camera housing.

19. The method of claim 17, wherein the coupling the infrared detector to the pedestal reduces thermal expansion coefficient mismatch between the pedestal and the infrared detector, the pedestal adapted to provide heat dissipation and heat spreading to maintain a substantially thermally uniform surface for coupling to the infrared detector.

20. The method of claim 18, comprising electrically coupling the infrared detector to the substrate, wherein the pedestal is configured to provide a first thermal path between the infrared detector, the infrared camera housing, and the at least one lens, and wherein the substrate and the camera housing are configured to form a second thermal path between the die stack and the camera housing.

* * * * *